US006925555B2

(12) United States Patent
Chang et al.

(10) Patent No.: US 6,925,555 B2
(45) Date of Patent: Aug. 2, 2005

(54) SYSTEM AND METHOD FOR DETERMINING A PLURALITY OF CLOCK DELAY VALUES USING AN OPTIMIZATION ALGORITHM

(75) Inventors: Norman Chang, Fremont, CA (US); Shen Lin, Foster City, CA (US); Osamu Nakagawa, Redwood City, CA (US); Weize Xie, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 684 days.

(21) Appl. No.: 09/915,531

(22) Filed: Jul. 27, 2001

(65) Prior Publication Data

US 2003/0023327 A1 Jan. 30, 2003

(51) Int. Cl.[7] .............................. G06F 9/00; G06F 9/24
(52) U.S. Cl. ............................... 713/1; 713/100; 716/6
(58) Field of Search ......................... 713/1, 100; 716/6; 703/14

(56) References Cited

U.S. PATENT DOCUMENTS

| | | | | | |
|---|---|---|---|---|---|
| 5,570,045 | A | * | 10/1996 | Erdal et al. | 326/93 |
| 5,758,130 | A | | 5/1998 | Dhuey | 395/552 |
| 5,849,610 | A | | 12/1998 | Zhu | 438/129 |
| 6,075,832 | A | | 6/2000 | Geannopoulos et al. | 375/375 |
| 6,553,338 | B1 | * | 4/2003 | Buch et al. | 703/14 |
| 6,559,701 | B1 | * | 5/2003 | Dillon | 327/293 |
| 6,625,787 | B1 | * | 9/2003 | Baxter et al. | 716/6 |

OTHER PUBLICATIONS

Westhead et al, A comparison of heuristic search algorithms for molecular docking, 1997, Journal of Computer–Aided Molecular Design, vol. 11, pp. 209–228.*
SNU Dept. of Computer Engineering, Artificial Intelligence Cource, 1999.*
http://web.archive.org/web/20010224045751/http://www.doc.ic.ac.uk/~nd/surprise_96/journal/vol4/tcw2/report.html, Genetic Algorithms, Feb. 24, 2001.*
Liu, X. et al., " Maximizing Performance by Retiming and Clock Skew Scheduling", Design Automotation Conference, 1999, pp. 231–236.
Papaefthymiou, M. et al., " Retiming and Clock Scheduling for High–Performance Synchronous Circuits", 10 pages, date unknown.
Kourtev, I. et al., " Timing Optimization Through Clock Skew Scheduling", Kluw er Academic Publishers, 2000, pp. 1–194.

* cited by examiner

Primary Examiner—Thomas Lee
Assistant Examiner—Mark Connolly

(57) ABSTRACT

A method determines a plurality of clock delay values. Each delay value is associated with a delay element on a clock line leading to a clock sink in a synchronous circuit. The method determines an initial set of delay values and executes an optimization algorithm, beginning with the initial set of delay values, to arrive at a set of delay values that at least approximately meets an criteria while satisfying timing constraints associated with selected pairs of logically connected clock sinks. In a preferred form, the optimization algorithm is a genetic algorithm or a gradient descent algorithm. The genetic algorithm involves selecting parent sets of delay values, crossing over so as to produce a child set of delay values, mutating the child set of delay values, evaluating how well the child set of delay values meets the criteria, and conditionally discarding the child set on the basis of the evaluating step. The gradient descent algorithm involves perturbing the initial set of delay values, evaluating how well the perturbed set of delay values meets the criteria, and conditionally discarding the perturbed set on the basis of the evaluating step. If the perturbed set is not discarded, then the gradient descent algorithm adjusts the values of the perturbed set in the same direction relative to the corresponding values in the initial set.

23 Claims, 6 Drawing Sheets

SYSTEM AND METHOD FOR DETERMINING A PLURALITY OF CLOCK DELAY VALUES USING AN OPTIMIZATION ALGORITHM

FIELD OF THE INVENTION

This invention relates generally to synchronous digital circuitry such as that used in computers and digital processing systems, and more particularly to synchronization of clock or timing signals using delay.

BACKGROUND OF THE INVENTION

Synchronous (i.e., clocked or pulsed) circuits must operate within timing constraints. Synchronous logic circuits typically include a clock distribution network for providing a clock signal to various sub-circuits. A typical clock network includes one or more clock sources that are coupled to a number of clock "sinks." A clock sink is any circuit or set of circuits accepting a clock input. In their simplest form, clock sinks are flip-flops and latches. Examples of more sophisticated sinks, involving several flip-flops or latches in the same time domain, include registers, counters, and state machines.

FIG. 1 illustrates clock distribution throughout parts of a synchronous logic circuit 100. The circuit 100 may be a VLSI (very large scale integration) integrated circuit, such as a microprocessor. The circuit 100 comprises a clock 110 and several clock sinks 120 connected to the clock 110 by clock lines (also called traces) 130. The circuit 100 also comprises logic circuits (not shown) interconnecting the sinks 120. The physical path lengths along the clock lines 130 to each sink 120 are generally different. Because of the non-uniform lengths of clock lines and other factors such as trace resistance, trace capacitance and load capacitance, clock pulses generally arrive at each sink 120 at different times. In other words, the clock signals are generally out of phase when they arrive at the sinks 120. A measure of this phase mismatch or non-uniformity in clock arrival time is "clock skew." The skew between a clock signal at two points is the time delay or phase difference between the clock signals at those two points. In the circuit 100 having several clock sinks 120, maximum clock skew between any two sinks 120 is usually specified as some percentage (e.g., 10%) of the clock period.

Excessive clock skew is undesirable. If clock skew is too great, then the sinks 120 may fail to operate together properly. If a clock signal arrives at a sink 120 too early or too late relative to other events, then the circuit 100 may experience race conditions. Another negative consequence is that clock skew can be a limiting factor in how fast the clock 110 can operate. Misoperation and clock speed limitations result from violations of a setup or hold time of a sink 120.

FIGS. 2A and 2B illustrates setup and hold times for the case where the sink is a latch. FIG. 2A shows a dynamic latch 200 accepting an input D and a clock signal CLK. The dynamic latch 200 produces an output Q, which follows the input D, after a small delay, when the clock signal CLK is high and remains in the same state when the clock signal CLK is low. FIG. 2B shows waveforms of the clock signal CLK, the input D and the output Q. As shown in FIG. 2B, the input D pulses high briefly. In order for the output Q to follow the input D, the input pulse must be high for a setup time $T_S$ before the clock signal CLK falls low and stay high for a hold time $T_H$ after the clock signal CLK falls low. The setup time $T_S$ or the hold time $T_H$ may be violated if the clock signal CLK drifts, as can happen when there is excessive clock skew.

In the prior art, there are several approaches for minimizing clock skew. One approach is "retiming," typified by U.S. Pat. No. 5,849,610. Retiming is physical placement of sinks and re-routing of clock lines to equalize path length. However, perfect distance equalization is seldom possible. Other design considerations often mandate sink and trace placement. Furthermore, physical distance is only one factor affecting propagation delay.

Another approach is the method of U.S. Pat. No. 6,075,832, which discloses variable delay elements on clock lines. The delay amounts are controlled by feedback control using a delay locked loop that dynamically equalizes delay during circuit operation. A disadvantage of this method is that it is complex, requiring extra space and power in the circuit.

Yet another approach is "clock scheduling," such as disclosed in its most elementary form in U.S. Pat. No. 5,758,130. According to that patent, a delay is introduced along a shorter clock trace so as to synchronize its arrival with that of a longer clock trace. More generally, clock scheduling involves delaying clock signals before the clock inputs to various sinks, so that the clock signals arrive at their destination sinks at the same time (zero skew scheduling) or in some other desired relationship with each other (non-zero clock skew scheduling). Ivan S. Kourtney and Eby G. Friedman, "Timing Optimization through Clock Skew Scheduling," Kluwer Academic Publishers, 2000 (ISBN 0-7923-7796-6), which is hereby incorporated by reference, discusses non-zero clock scheduling problem in great detail and discloses solutions based on linear programming and quadratic programming. Unfortunately, both techniques, which are entirely deterministic, do not always converge to a solution to this problem.

SUMMARY OF THE INVENTION

In one respect, the invention is a method for determining a plurality of clock delay values. Each delay value is associated with a delay element on a clock line leading to a clock sink in a synchronous circuit. The method determines an initial set of delay values and executes an optimization algorithm, beginning with the initial set of delay values, to arrive at a set of delay values that at least approximately meet a criteria while satisfying timing constraints associated with selected pairs of logically connected clock sinks. The optimization algorithm randomly modifies the set of delay values. In one embodiment, the timing constraints are defined in terms of setup and hold times. In preferred forms, the optimization algorithm is a genetic algorithm or a gradient descent algorithm.

In another respect, the invention is an synchronous logic circuit having delay elements determined by the above method.

In yet another respect, the invention is a computer readable medium on which is embedded computer software that performs the above method.

In comparison to known prior art, certain embodiments of the invention are capable of achieving certain advantages, including some or all of the following: (1) the algorithms are capable of converging when other solutions do not; (2) the algorithms are capable of converging to a better solution than prior art solutions; (3) the algorithms converge more quickly than other solutions; and (4) the algorithms are adaptable to variations from device to devices. Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 3:
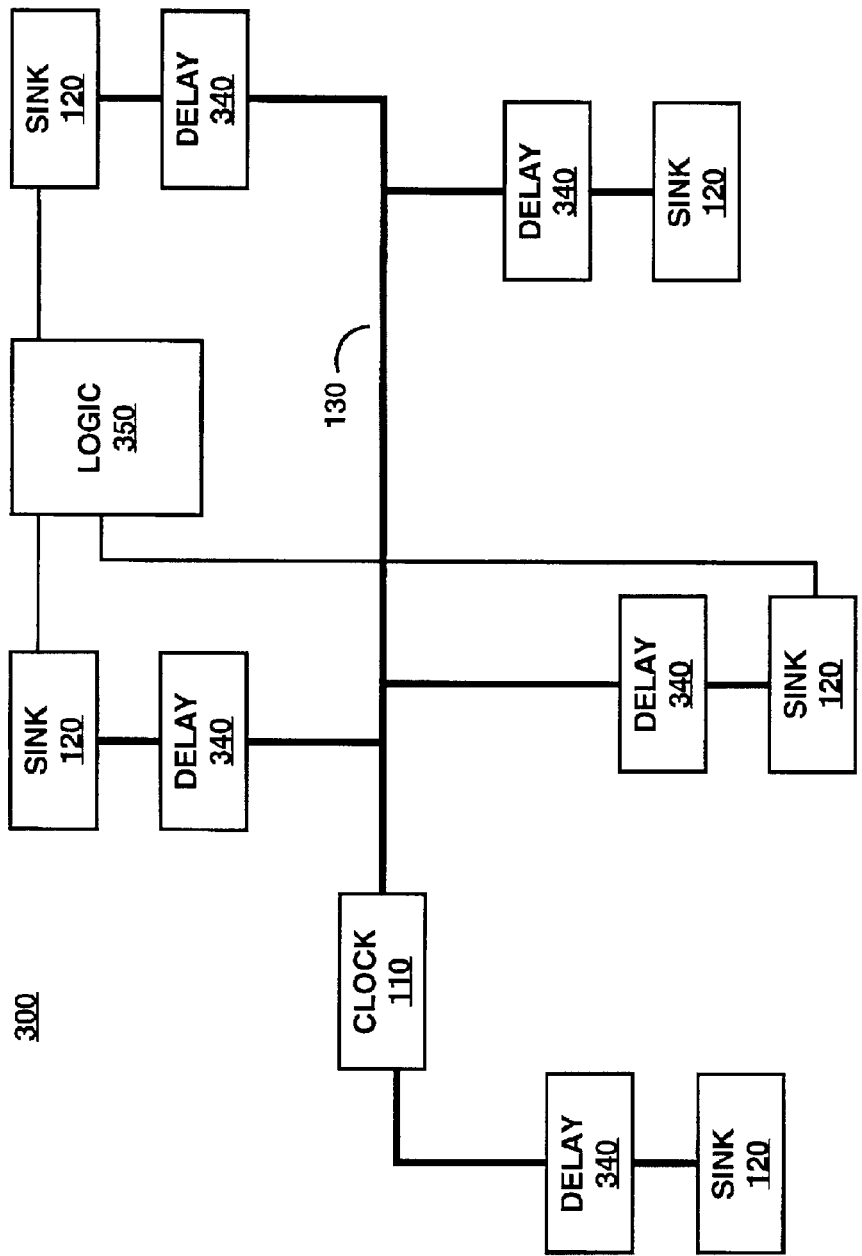
FIG. 3 is a block diagram illustrating clock distribution throughout parts of a synchronous logic circuit, according to an embodiment of the invention.

FIG. 3 is a block diagram illustrating clock distribution throughout parts of a synchronous logic circuit 300, according to an embodiment of the invention. Like the circuit 100, the circuit 300 comprises a clock 110 and several clock sinks 120 connected to the clock 110 by clock lines 130. Unlike the circuit 100, the circuit 300 also comprises delay elements 340 connected before each sink 120. Although FIG. 3 shows one delay element 340 for each sink 120, a delay element 340 can feed multiple sinks, or some sinks may not have delay elements on their clock inputs. The delay elements 340 can be buffers, series circuits of an even number of inverters or any other means for delaying a signal known to those skilled in the art. The delay elements 340 are adjustable either dynamically during operation of the circuit 300 or statically during manufacture or initial configuration of the circuit 300. Preferably, a delay element 340 is constructed as a series of even number of inverts, every second output of which is input to a multiplexer, whose select lines are used to control which output and thus how much delay is provided. Alternate structures for the delay elements 340 include delay locked loops and a series of inverters having controllable power supply voltages. Regardless of the structure of the delay elements 340, techniques for selecting the set of delay values for the delay elements 340 is described in detail below.

FIG. 3 also illustrates a logic circuit 350 interconnecting some of the sinks 120. Many other logic circuits are likely present in the circuit 300, but only one is illustrated for clarity. The logic circuit 350 operates on data flowing from sink(s) to sink(s). Two sinks 120 and the logic circuit 350 interconnecting them form a local datapath. The circuit 300, if typical of most logic systems, contains a large number of local datapaths.

Figure 4:
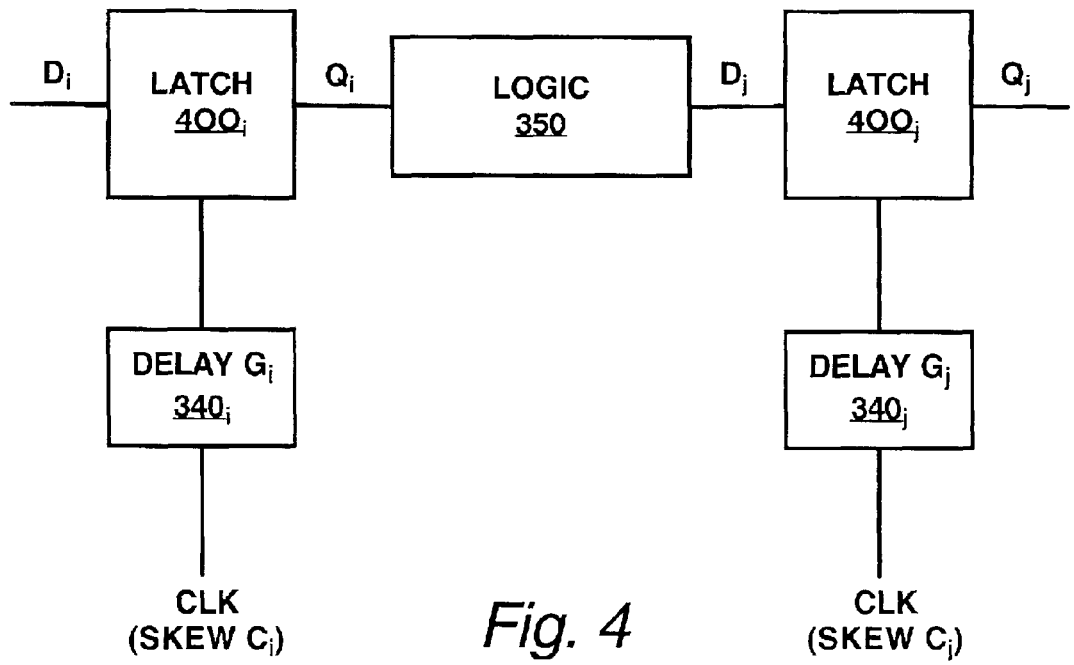
FIG. 4 is a diagram illustrating a configuration of tuned delay elements used for clock distribution along a local datapath, according to one embodiment of the invention.

FIG. 4 illustrates a local datapath in greater detail, for the case where the sinks are latches. The local datapath begins at a latch $400_i$, where a signal $D_i$ is input and a signal $Q_i$ is output. The signal $Q_i$ is input to the logic circuit 350, which outputs a signal $D_j$. A latch $400_j$ accepts as input the signal $D_j$ and outputs a signal $Q_j$. A clock signal CLK is also supplied to the latches $400i$ and $400j$. The clock signal CLK going to the latch $400_i$ has a skew $C_i$ relative to some reference. The clock signal CLK going to the latch $400_j$ has a skew $C_j$ relative to the same reference. Delay elements $340_i$ and $340_j$ introduce additional delay in the clock signal CLK before reaching the latches $400_i$ and $400_j$, respectively. The delay values for the delay elements $340_i$ and $340_j$ are chosen to satisfy the setup and hold time constraints of the latches $400_i$ and $400_j$, as will be explained next.

Assume multiple paths traverse across the logic circuit 350. Denote the longest propagation delay of these paths as $D_{ijL}$, and the shortest as $D_{ijS}$. Then the setup and hold time constraints are given by the following inequalities:

$$T_{Si}+C_i+G_i+D_{ijL}<T_{CLK+}+C_j+G_j \quad (1)$$

$$C_i+G_i+D_{ijS}>C_j+G_j+T_{Hj} \quad (2)$$

where $T_{CLK+}$ is the nominal duration of a positive pulse on the clock signal CLK, assuming that the latches activate upon a positive clock pulse, and $T_{Si}$ and $T_{Hj}$ are the setup and hold times for the latches $400i$ and $400j$, respectively. As a simplification, which is often true, the setup times and hold times for each latch may be assumed to be the same, in which case the i and j subscripts can be dropped from $T_{Si}$ and $T_{Hj}$.

As an alternative, the constraint inequalities (1) and (2) can be modified to include a safety margin, SM, as follows:

$$T_{Si}+C_i+G_i+D_{ijL}+SM<T_{CLK+}+C_j+G_j \quad (3)$$

$$C_i+G_i+D_{ijS}-SM>C_j+G_j+T_{Hj} \quad (4)$$

Including SM can result in a solution that is less sensitive to operating variations, such as might arise from voltage or temperature variations. However, including SM can also constrain the solution space such that a less optimal solution results.

Figure 1:
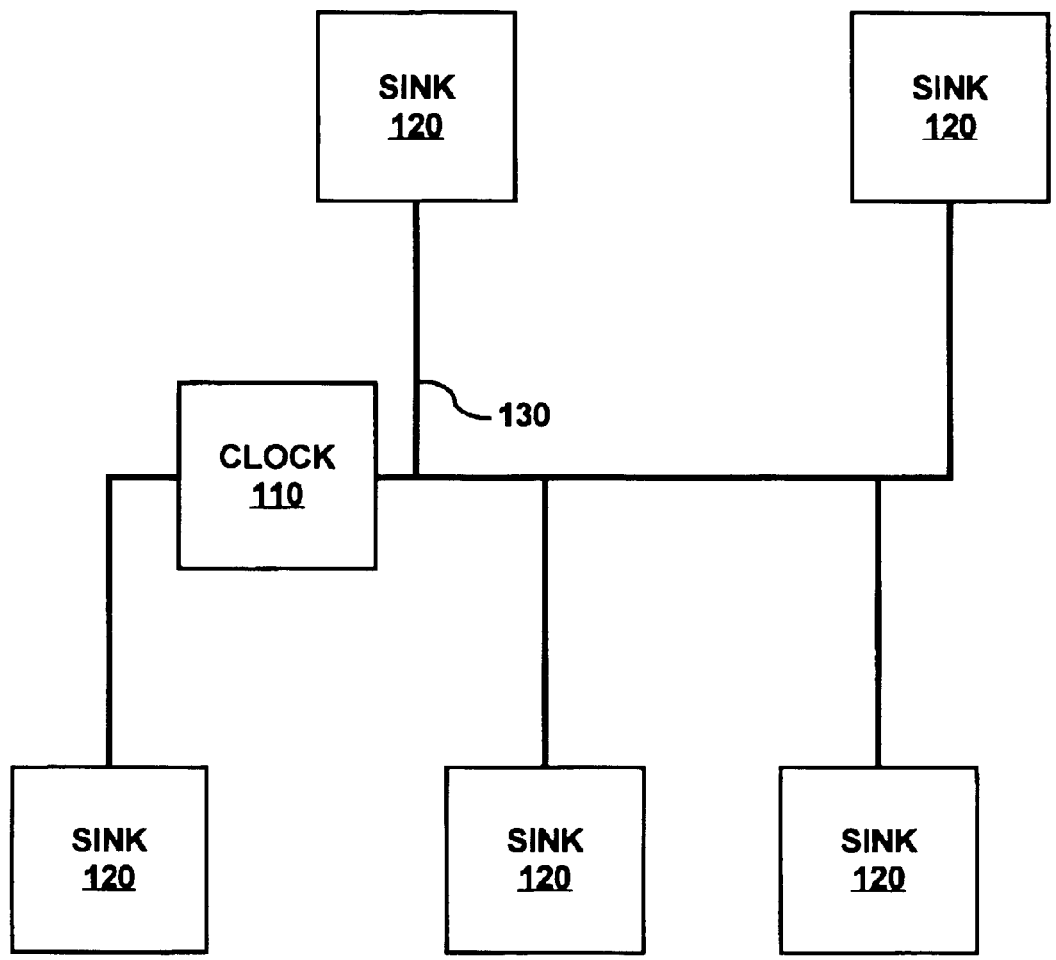
FIG. 1 is a diagram illustrating clock distribution throughout parts of a synchronous logic circuit.
Figure 2A:
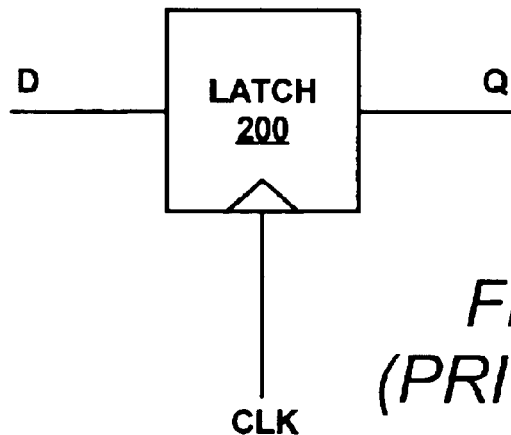
FIG. 2 illustrates setup and hold times during a pulse of a clock signal.
Figure 2B:
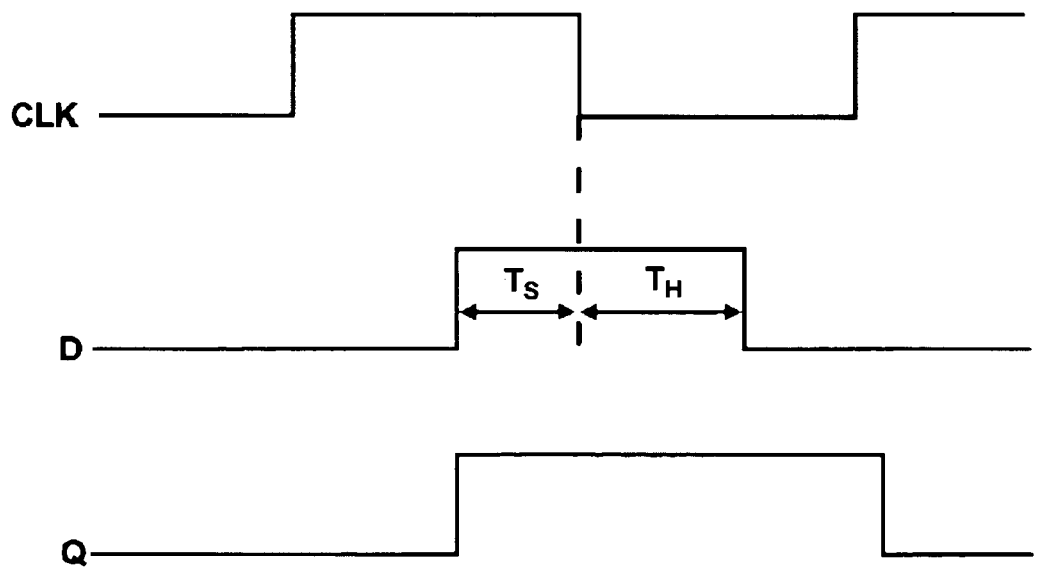

The inequalities (1)–(4) are illustrative, and not limiting, examples of timing constraints between two sinks connected by logic. The inequalities (1)–(4) are appropriate for the latches $400_i$ and $400_j$, which are edge-triggered as shown in FIG. 2B. Similar inequalities can be stated for latches triggered on the opposite clock edge, or for level-triggered sinks. Furthermore, other timing constraints involving other device and signal parameters are possible.

For a circuit containing N sinks, there are between order (N) and order($N^2$) possible local datapaths. For each datapath there is a timing constraint, such as a pair of inequalities in the same form as (1) and (2) (or (3) and (4)), that must be satisfied. A solution to this set of inequalities is any set of delay values $\{G_k: 1 \leq k \leq N\}$ satisfying all the inequalities. The solution space may be further constrained by the realizable limits of the delay values (e.g.,–128 ps (picoseconds)$\leq G_k \leq$128 ps and/or only discrete values of $G_k$ possible $\forall$ k). Although there are potentially many solutions to this set of inequalities, a solution that is optimum or nearly optimum in some sense is preferred. There are many possible criteria that define the optimum, including, by way of illustration and not limitation, the following:

$$\min(T_{CLK+}) \quad (5)$$

$$\min(\Sigma G_k) \text{ or } \max(\Sigma G_k) \quad (6)$$

$$\min[\Sigma(T_{skew}(i,j)-G_{ij})^2] \quad (7)$$

In each case the criteria is minimization (or maximization) of some quantity, which is termed the "objective function." The criteria in expression (5) is minimization of the clock signal's positive pulse width and, indirectly, the clock period (i.e., maximization of clock frequency). The objective function in expression (6) the total added delay, summed across all delay elements $G_k$, $1 \leq k \leq N$. Note that maximization of $\Sigma G_k$, though not an intuitive thing to do, is a valid criteria; note that because clock signals are periodic, a large delay is functionally equivalent to a smaller delay modulo the clock period. The objective function in expression (7) is the sum of squared norms of total skew $T_{skew}(i,j)$ from some target clock skew, $G_{ij}$, such as a value in the middle of a permissible range, for all connected pairs i–j of delay elements. $T_{skew}(i,j)$ may be defined as $G_i-G_j$ or $(C_i+G_i)-(C_j+G_j)$.

Figure 6:
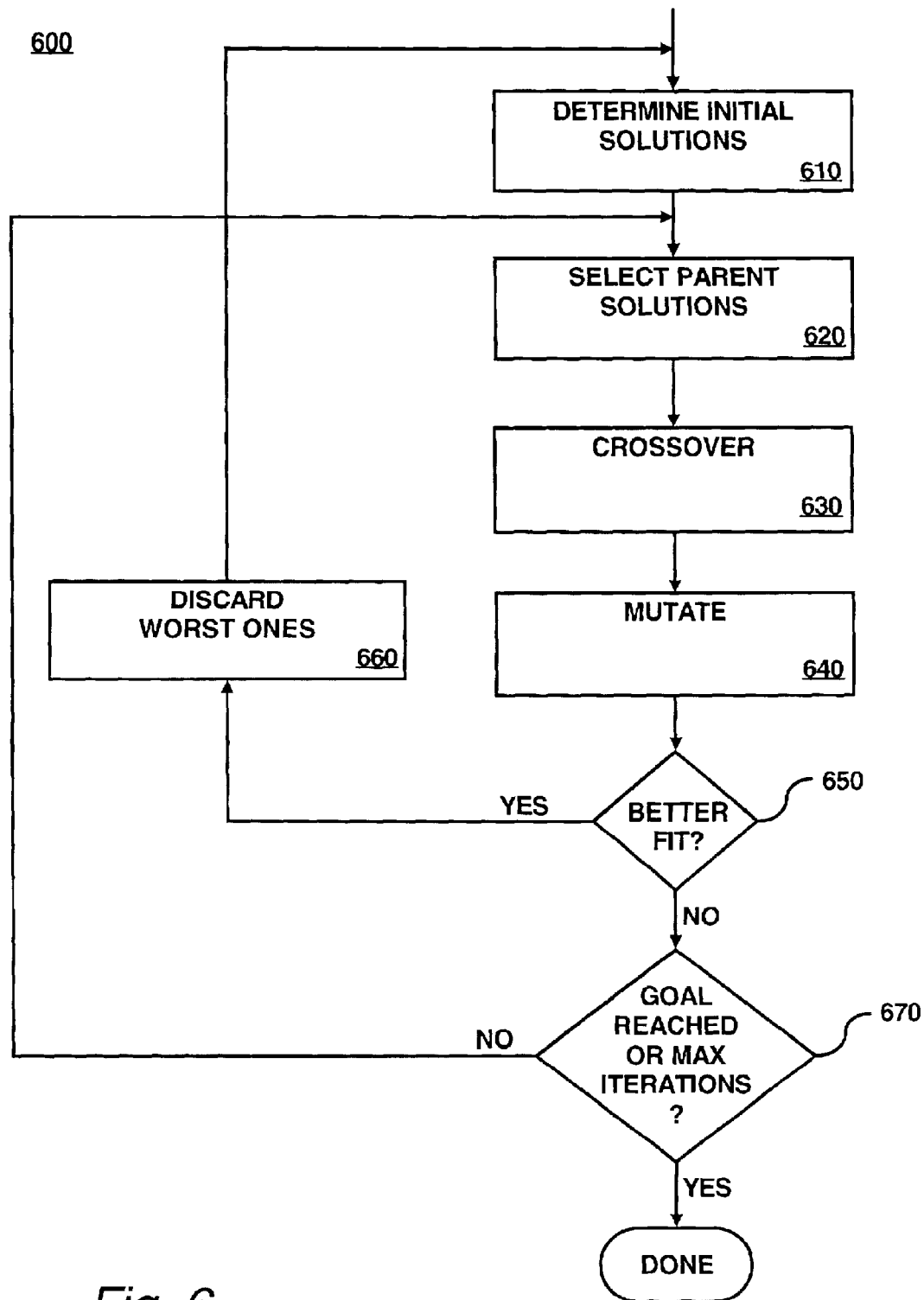
Figure 7:
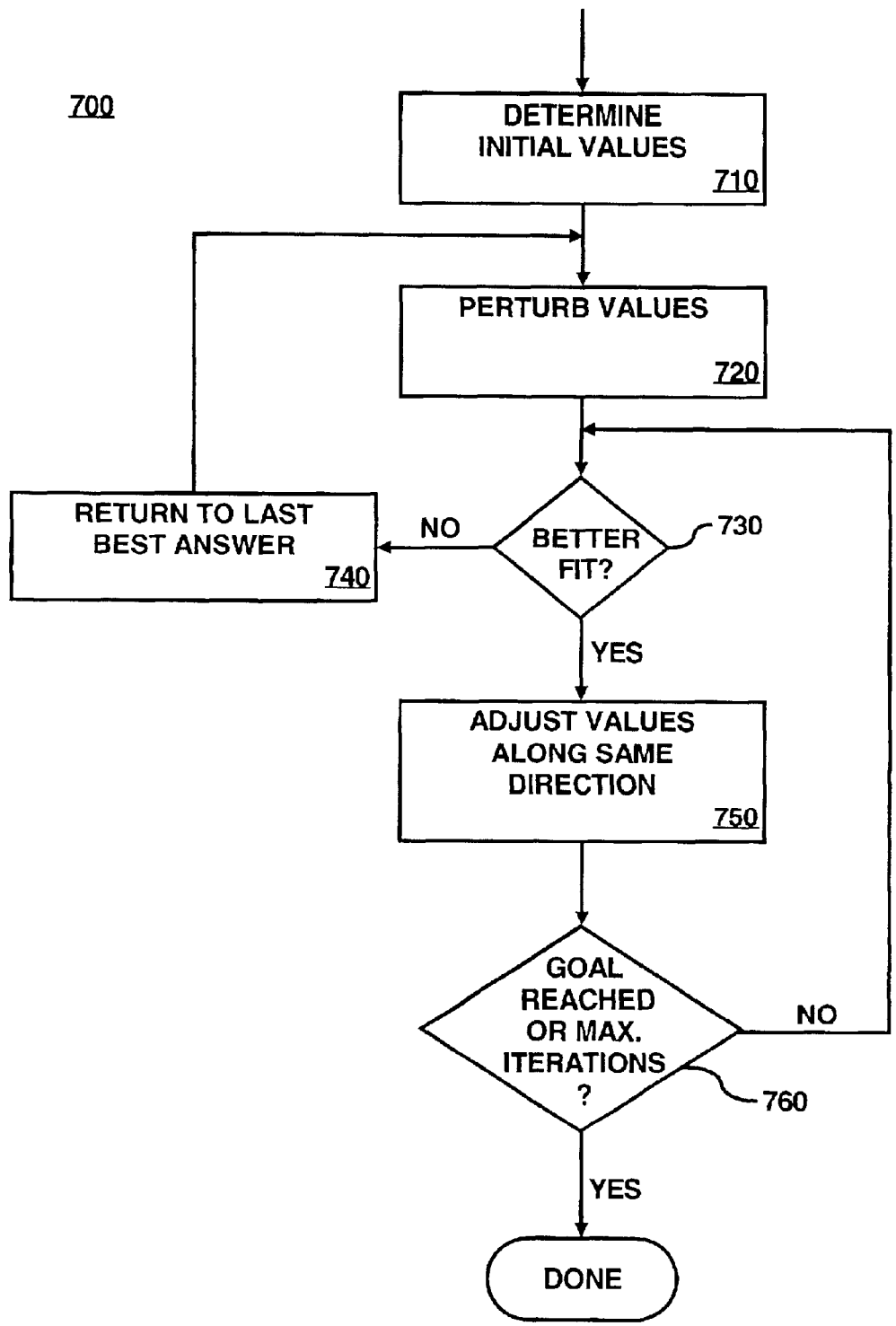

Given some optimization criteria, such as those in expressions (5)–(7), the problem is to select delay values $G_k$, $1 \leq k \leq N$, within the solution space such that the optimization criteria is met or approximately met. In other words, the problem is to determine the optimum or approximately optimum solution, as defined by the given optimization criteria, subject to the setup and hold time constraints (which define the solution space). Methods for solving this problem are illustrated in FIGS. 5–7.

Figure 5:
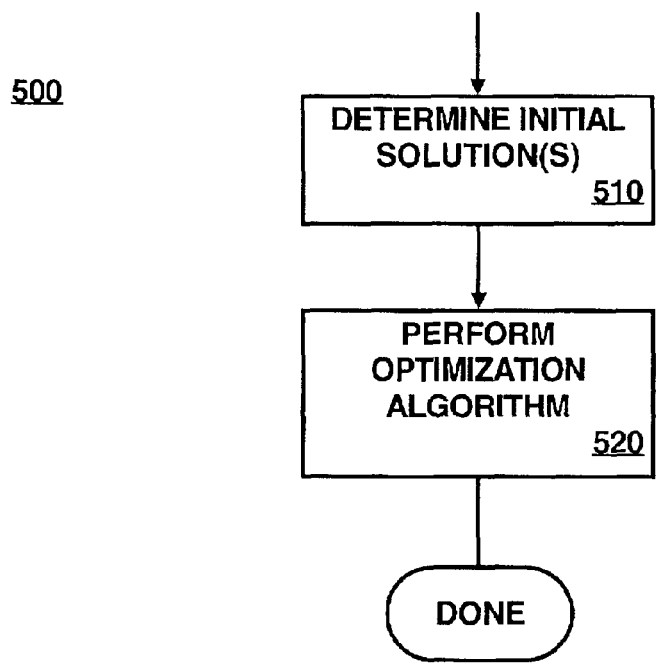
FIGS. 5–7 are flowcharts of timing optimization algorithms, according to embodiments of the invention.

FIG. 5 is a flowchart of a generalized timing optimization method 500. The method 500 comprises two steps: determining (510) an initial set of delay values and performing (520) an optimization algorithm. The initial set of delay values may or may not be a solution, i.e., they may or may not satisfy the constraints, such as, for example, the setup and hold time inequalities (1) and (2). The optimization algorithm, which is preferably iterative, refines the initial set of delay values so as to converge toward a solution that at least approximately meets a given criteria. In other words, the optimization algorithm searches the space of potential solutions to find a solution that is optimum or nearly optimum according to the given criteria. The optimization algorithm operates with some randomness, rather than being purely deterministic. As described below, the optimization algorithm is preferably a genetic algorithm or a gradient descent algorithm; however, other optimization algorithms involving a random component, such as simulated annealing or stochastic programming, are equally possible.

In one form, the optimization algorithm is a genetic algorithm. FIG. 6 is a flow chart of a timing optimization method 600 based on a genetic algorithm. The method 600 begins by determining (610) a set of potential solutions. Each potential solution is an N-tuple of delay values $G_k$, $1 \leq k \leq N$. The initial potential solutions are preferably random or determined by a linear programming or quadratic programming algorithm, which are wellknown in the art but do not typically converge to the correct solution.

Next, the method 600 selects (620) parent potential solutions. Preferably, the selecting step 620 is performed by conducting a tournament. In a preferred tournament, the parents are selected randomly with probability proportional to their fitness values, which are measures of how well the solutions meet the optimization criteria. For example, if the optimization criteria is defined by min($\Sigma G_k$), then potential solutions in the population are assigned a selection probability inversely related to the quantity $\Sigma G_k$ for each potential solution. Optionally, the function mapping from an objective function value to a fitness value could involve scaling.

Next, the method 600 crosses-over (630). The crossing-over step 630 is a breeding or mating step, to produce children potential solutions. In a preferred form, the crossing-over step 630 produces two children from two parents. In the case where each delay value $G_k$ is a discrete variable, a potential solution may be represented as a concatenation of the binary representations of each delay value: $G_1:G_2: \ldots :G_N$. With both parents represented in this manner, the crossing-over step 630 can be visualized by aligning a copy of one parent's bit pattern above a copy of the other's. Next, the crossing-over step 630 divides the parents' bit patterns into a number of regions. The number of regions and their endpoints are preferably random. Then, the crossing-over step randomly swaps the bits within each region, region by region independently. The resulting bit patterns are the two children. Each child has parts (i.e., regions) of each parent (except the very rare case in which no swaps occur). The size, number and locations of regions is arbitrary.

Next, the method 600 mutates (640) each delay value ($G_k$) in the children. The preferred mutation is a Gaussian randomized mutation on a sink-by-sink basis. In this case, the mutation step 640 adds to each delay value $G_k$ in a child solution a Gaussian random variable. Preferably, the Gaussian random variable is $N(0,\sigma)$ where $3\sigma$ is approximately one clock period. In one embodiment, each delay value $G_k$ is discrete and quantized to 6 bits (and thus having 64 possible values) equally spaced from zero to one clock period, and the Gaussian random variable is likewise rounded to truncated to the same resolution.

After the mutation step 640, the method 600 checks (650) whether the mutated potential solution is a better than the previous one (before mutation). The checking step 650 evaluates the relevant objective function for potential solutions before and after mutation. If the mutation is better, then the method 600 discards (660) the worst solutions from consideration and iterates the steps 610–650, returning to the determining step 610 to determine new potential solutions to replace the discarded ones. If the mutated potential solution is not better, then the method 600 tests (670) whether the goal has been reached or the maximum number of iterations have been performed. In either case, the method 600 terminates. The goal may be expressed as being within some tolerance of the ideal or a desired solution.

Determination of which potential solutions are better or more fit preferably involves both constraint satisfaction and meeting the optimization criteria. A true solution (i.e., satisfying the constraints) is better or more fit than a non-solution. Between two solutions, the one that better meets the optimization criteria is better or more fit than the other.

Genetic algorithms, per se, are known. In the parlance of genetic algorithms, each solution is a "chromosome," the whole set of potential solutions under consideration is a "population" or "colony," and each iteration of the steps 610–660 is an "epoch" or "generation." Those skilled in the art can vary the method 600 within the understanding of genetic algorithms. For example, the size of the population is largely arbitrary, but a population that is too small may take too long to converge while a population that is too large may never drift towards any direction and therefore never converge.

In another form, the optimization algorithm is a gradient descent algorithm. FIG. 7 is a flowchart of a timing optimization method 700 based on a gradient descent algorithm. The method 700 begins by determining (710) initial delay values. The initial delay values are preferably all-zero or determined by a linear programming or quadratic programming algorithm. The method 700 next perturbs (720) the delay values. The perturbations are preferably random steps that increase, decrease or hold unchanged each delay value. Preferably, the perturbation is one of three effects: increase by a fixed amount, decrease by the fixed amount or hold unchanged. In one embodiment, each delay value $G_k$ is discrete and quantized to a number of bits, the fixed amount is a single bit resolution. The method 700 next checks (730) whether the perturbed solution is better than the unperturbed solution. The checking step 730 evaluates the relevant objective function for solutions before and after perturbation. If the perturbed solution is not better, the method 700 discards it and returns (740) to the last best solution before repeating the perturbation step 720. This loop continues until a better solution is found, at which point, the method 700 can be said to be moving in the right direction (or down the "gradient"). Thereafter, the method 700 continues to adjust (750) the delay values in the same direction (i.e., for each delay value adjusting the amount by which that delay value is increased or decreased). After each adjustment, the method 700 tests (760) whether the goal has been reached or the maximum number of iterations have been performed. In either case, the method 700 terminates.

Gradient descent algorithms, per se, are known. Those skilled in the art can vary the method 700 within the understanding of gradient descent algorithms.

The methods 500, 600 and 700 are preferably applied to a synchronous circuit or system near the final steps in production. After manufacture of a batch of circuits, the circuit parameters, such as longest and short path delays, setup and hold times, and nominal clock skews can be measured for each device in the batch. Alternatively, these quantities can be analytically estimated for the entire batch before. However, manufacturing process variations can cause these parameters to differ from device to device. After measuring the pertinent parameters for a particular device, the methods 500, 600 or 700 can be used to determine the set of delay values to be programmed into the delay elements of the device. In this way, the methods 500, 600 and 700 are adaptable. Furthermore, the solutions attained by the methods 500, 600 and 700 are often less sensitive to operating variations, such as voltage and temperature variations, especially when a safety margin is included in the constraint equations or when the optimization criteria involves target skew values.

The methods 500, 600 and 700 can be applied to an entire clock scheduling problem wholly. Alternatively, multiple instances of methods 500, 600 and 700 can be run, each applied to a partition of the overall clock scheduling problem; then, the individual solutions can be patched together.

The methods 500, 600 and 700 can be performed by computer programs, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form. Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for determining a plurality of clock delay values, each delay value associated with a delay element on a clock line leading to a clock sink in a synchronous circuit, the method comprising:
   determining an initial set of delay values; and
   executing an optimization algorithm, beginning with the initial set of delay values, to arrive at a set of delay values that at least approximately meat a criteria while satisfying timing constraints associated with selected pairs of logically connected clock sinks such that clock signals to clock sinks are synchronized, wherein the optimization algorithm comprises randomly modifying the set of delay values;
   wherein the timing constraints are defined substantially as follows:

$$T_S + C_i + G_i + D_{ijL} < T_{CLK+} + C_j + G_j$$
   $$C_i + G_i + D_{ijS} > C_j + G_j + T_H$$

where $T_S$ is the setup time, $T_H$ is the hold time, $D_{ijL}$ is the longest propagation delay between a pair logically connected clock sinks i and j, $D_{ijL}$ is the shortest propagation delay between a pair of logically connected clock sinks i and j, $C_i$ and $C_j$ measure relative clock skew between the sinks i and j, and $G_i$ and $G_j$ the delay values for the sinks i and j out of the set of delay values.

2. The method of claim 1 wherein the determining step comprises:
   randomly selecting the initial set of delay values.

3. The method of claim 1 wherein the determining step comprises:
   executing a linear programming algorithm to determine the initial set of delay values.

4. The method of claim 1 wherein the determining step comprises:
   executing a quadratic programming algorithm to determine the initial set of delay values.

5. The method of claim 1 wherein the optimization algorithm is a genetic algorithm.

6. The method of claim 5 wherein determining step comprise:
   determining multiple initial sets of delay values.

7. The method of claim 5 wherein the genetic algorithm comprises the following steps:
   selecting parent sets off delay values;
   crossing over so as to produce a child set of delay values;
   mutating the child set of delay values;
   evaluating how well the child set of delay values meets the criteria; and
   conditionally discarding the child set on the basis of the evaluating step.

8. The method of claim 7 wherein the selecting step comprises:
   conducting a random tournament.

9. The method of claim 7 wherein the crossing over step comprises:
   dividing two parents into corresponding regions, wherein the number and locations of the regions are random; and
   randomly swapping corresponding regions of the parents, so as to result in two region-by-region swapped set of delay values that are children.

10. The method of claim 7 wherein the mutating step comprises:
adding to each delay value in the child set of delay values a Gaussian random variable having zero mean and a predetermined variance.

11. The method of claim 7 wherein the evaluating step comprises:
calculating an objective function for the child set; and
determining whether the child set satisfies the timing constraints.

12. The method of claim 7 further comprising:
iteratively repeating the selecting, crossing over, mutating, evaluating and conditionally discarding steps.

13. The method of claim 1 wherein the optimization algorithm is a gradient search algorithm.

14. The method of claim 13 wherein the gradient descent algorithm comprises the following steps:
perturbing a set of delay values;
evaluating how well the perturbed set of delay values meets the criteria; and
conditionally discarding the perturbed set on the basis of the evaluating step.

15. The method of claim 14 further comprising:
iteratively repeating the perturbing, evaluating and conditionally discarding steps; and
if the perturbed set is not discarded, then adjusting the values of the perturbed set in the same direction relative to the corresponding values is the initial set.

16. The method of claim 14 wherein the perturbing step comprises randomly perturbing the initial set of values.

17. The method of claim 1 wherein the criteria is minimization of a quantity selected from the group consisting of a quantity related to a clock frequency, a quantity related to a sum of the set of delay values, and a quantity related to the distances of the delay values from a target.

18. The method of claim 1, wherein the timing constraints comprise at least one safety margin.

19. A synchronous circuit comprising:
a plurality of clock sinks;
a plurality of clock delay elements connected to the clock sinks, each clock delay element having a delay value, wherein the delay values are set according to a method comprising a step of determining initial values for the delay values and a step of executing an optimization algorithm, beginning with the initial set of delay values, to arrive at a set of delay values that at least approximately meet a criteria while satisfying timing constraints associated with selected pairs of logically connected clock sinks such that clock signals to clock sinks are synchronized, wherein the optimization algorithm comprises randomly modifying the set of delay values;
wherein the timing constraints are defined substantially as follows:

$$T_S + C_i + G_i + D_{ijL} < T_{CLK+} + C_j + G_j$$

$$C_i + G_i + D_{ijS} > C_j + G_j + T_H$$

wherein $T_S$ is the setup time, $T_H$, is the hold time, $D_{ijL}$ is the longest propagation delay between a pair of logically connected clock sinks i and j, $D_{ijS}$ shortest propagation delay between a pair of connected clock sink i and j, $C_i$ and $C_j$ measure clock skew between the sinks i and j, and $G_i$ and $G_j$ are the delay volume for the sinks i and j out of the set of delay values.

20. A computer readable storage device on which is embedded computer software, the software comprising a program, the program performing a method for determining a plurality of clock delay values, each delay value associated with a delay element on a clock line leading to a clock sink in a synchronous circuit, the method comprising:
determining an initial set of delay values; and
executing an optimization algorithm, beginning with the initial set of delay values, to arrive at a set of delay values that at least approximately meet a criteria while satisfying timing constraints associated with selected pairs of logically connected clock sinks such that clock signal to clock sinks are synchronized, wherein the optimization algorithm comprises randomly modifying the set of delay values;
wherein the timing constraints are defined substantially as follows:

$$T_S + C_i + G_i + D_{ijL} < T_{CLK+} + C_j + G_j$$

$$C_i + G_i + D_{ijS} > C_j + G_j + T_H$$

wherein $T_S$ is the setup time, $T_H$ is the hold time, $D_{ijL}$ is the shortest propagation delay between a pair of logically connected clock sinks i and j, $D_{ijS}$ is the shortest propagation delay between a pair of logically connected clock sinks i and j, $C_i$ and $C_j$ measure relative clock skew between the sinks i and j, and $G_i$ and $G_j$ are the delay values for the sinks i and j out of the set of delay values.

21. A system for determining a plurality of clock delay values, each delay value associated with a delay element on a clock line leading to a clock sink in a synchronous circuit, the system comprising:
means for determining an initial set of delay values; and
means for executing an optimization algorithm, beginning with the initial set of delay values, to arrive at a set of delay values that at least approximately meet a criteria while satisfying timing constraints associated with selected pairs of logically connected clock sinks such that clock signals to clock sinks are synchronized, wherein the optimization algorithm comprises randomly modifying the set of delay values;
wherein the timing constraints are defined substantially as follows:

$$T_S + C_i + G_i + D_{ijL} < T_{CLK+} + C_j + G_j$$

$$C_i + G_i + D_{ijS} > C_j + G_j + T_H$$

wherein $T_s$ is the setup time, $T_H$ is the hold time , $D_{ijL}$ is the longest propagation delay between a pair of logically connected clock sinks i and j $D_{ijL}$ is the shortest propagation delay between a pair of logically connected clock sinks i and j $C_i$ and $C_j$ measure relative clock skew between the sinks i end j, and $G_i$ and $G_j$ are the delay values for the sinks i and j out of the set of delay values.

22. The system of claim 21 wherein the optimization algorithm is a genetic algorithm.

23. The system of claim 21 wherein the optimization algorithm is a gradient search algorithm.

* * * * *